United States Patent
Fukushima et al.

(10) Patent No.: US 9,102,561 B2
(45) Date of Patent: Aug. 11, 2015

(54) AMORPHOUS ALLOY, MOLDING DIE, AND METHOD FOR PRODUCING OPTICAL ELEMENT

(71) Applicant: CANON KABUSHIKI KAISHA, Tokyo (JP)

(72) Inventors: Hirotaka Fukushima, Utsunomiya (JP); Satoko Midorikawa, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 160 days.

(21) Appl. No.: 13/972,746

(22) Filed: Aug. 21, 2013

(65) Prior Publication Data
US 2014/0053606 A1 Feb. 27, 2014

(30) Foreign Application Priority Data
Aug. 23, 2012 (JP) ................. 2012-183950

(51) Int. Cl.
| | |
|---|---|
| C03B 11/08 | (2006.01) |
| C22C 27/00 | (2006.01) |
| C22C 45/00 | (2006.01) |
| C23C 14/00 | (2006.01) |
| C23C 14/06 | (2006.01) |
| C22C 14/00 | (2006.01) |
| C22C 27/02 | (2006.01) |

(52) U.S. Cl.
CPC ............ *C03B 11/086* (2013.01); *C22C 27/00* (2013.01); *C22C 45/00* (2013.01); *C23C 14/0036* (2013.01); *C23C 14/0641* (2013.01); *C03B 2215/12* (2013.01); *C03B 2215/17* (2013.01); *C03B 2215/31* (2013.01); *C03B 2215/32* (2013.01); *C03B 2215/34* (2013.01); *C22C 14/00* (2013.01); *C22C 27/02* (2013.01); *C22C 2204/00* (2013.01)

(58) Field of Classification Search
CPC ............. C03B 11/086; C03B 2215/34; C03B 2215/12; C03B 2215/17; C03B 2215/31; C03B 2215/32; C22C 27/00; C22C 45/00; C22C 14/00; C22C 27/02; C22C 2204/00
See application file for complete search history.

(56) References Cited

U.S. PATENT DOCUMENTS

| | | | | |
|---|---|---|---|---|
| 2007/0023109 | A1* | 2/2007 | Bewlay et al. | 148/442 |
| 2007/0193304 | A1* | 8/2007 | Itakura et al. | 65/66 |
| 2008/0166596 | A1* | 7/2008 | Das et al. | 428/800 |

FOREIGN PATENT DOCUMENTS

| | | |
|---|---|---|
| JP | 60-246230 A | 12/1985 |
| WO | WO2007/046437 A1 | 4/2007 |

* cited by examiner

*Primary Examiner* — Queenie Dehghan
(74) *Attorney, Agent, or Firm* — Canon U.S.A. Inc., IP Division

(57) ABSTRACT

An amorphous alloy contains 54 at % or more and 79 at % or less Re, 8 at % or more and 28 at % or less Ir, and 11 at % or more and 18 at % or less Nb. A molding die includes a release film composed of the amorphous alloy. A method for producing an optical element, the method including press-molding a glass preform with the molding die.

3 Claims, 2 Drawing Sheets

AMORPHOUS ALLOY, MOLDING DIE, AND METHOD FOR PRODUCING OPTICAL ELEMENT

BACKGROUND OF THE INVENTION

1. Field of the Invention

The present invention relates to an amorphous alloy, a molding die that includes the amorphous alloy and is used in a method for producing a camera lens or the like, and a method for producing an optical element with the molding die.

2. Description of the Related Art

The present invention relates to a molding die used in a method for producing an optical element such as a lens or a prism by press-molding a glass raw material.

A technique for press-molding a glass raw material, which does not require grinding and polishing processes, offers a simple manufacturing process and realizes simple and low-cost production of lenses. Therefore, the press-molding technique has recently become widely used in production of, as well as lenses, prisms and other optical elements in general.

Examples of properties required for a die material used for producing such glass optical elements by press-molding include high heat resistance, high chemical stability, a high hardness, good releasability, and good processibility.

Many types of molding dies have been proposed so far. For example, Japanese Patent Laid-Open No. 60-246230 proposes a molding die prepared by processing cemented carbide, which has high heat resistance, high oxidation resistance, and a high hardness, into a desired shape and coating the surface thereof with a precious metal having chemical stability and good releasability from a glass raw material to form a release film.

Recently, various glass materials have become widely used in optical elements in order to realize various optical designs. Some of the glass materials contain highly reactive components such as phosphorus and fluorine. Thus, better releasability has been required for the release film of the molding die in order to steadily mold such glass materials into a shape. Accordingly, International Publication No. WO2007/046437 proposes a glass-molding die including an amorphous alloy having chemical stability and good releasability.

However, a release film of the molding die described in International Publication No. WO2007/046437, despite having chemical stability, does not have a high hardness because it is provided as a layer to be cut and processed. The hardness of an amorphous Pt—Hf—Zr—Ni alloy described in International Publication No. WO2007/046437 was 12 GPa (measured with a nanoindenter produced by Agilent Technologies, Inc.).

In a glass-molding process, dust emission inevitably occurs in a molding die and in slide portions of an apparatus. The hardness of carbide used as a die material is about 13 to 18 GPa. When the hardness of a coating film of the molding die is about 12 GPa as described above, flaws often occur in the coating film due to chips such as carbide chips being pinched by the die in the molding process. When such a molding die having flaws is used for producing a glass optical element, the flaws of the molding die transfer to the glass optical element. This results in the glass optical element having a poor appearance.

SUMMARY OF THE INVENTION

The present invention provides an amorphous alloy having chemical stability, good releasability, and a high hardness, and a molding die including the amorphous alloy, in which flaws are less likely to occur in a molding process. The present invention also provides a method for producing an optical element with the molding die.

The amorphous alloy according to the present invention contains 54 at % or more and 79 at % or less Re; 8 at % or more and 28 at % or less Ir; and 11 at % or more and 18 at % or less Nb.

The molding die according to the present invention includes a release film composed of the above-described amorphous alloy.

The method for producing an optical element according to the present invention includes press-molding a glass preform with the above-described molding die.

Further features of the present invention will become apparent from the following description of exemplary embodiments with reference to the attached drawings.

DESCRIPTION OF THE EMBODIMENTS

Hereinafter, the embodiments of the present invention will be described in detail with reference to the attached drawings.

An amorphous alloy according to the present invention is provided in order to address an issue of low hardness of existing amorphous alloys used for glass-molding dies, which is likely to result in the occurrence of flaws in the molding die and glass optical elements molded with the molding die.

The amorphous alloy according to the present invention contains 54 at % or more and 79 at % or less Re, 8 at % or more and 28 at % or less Ir, and 11 at % or more and 18 at % or less Nb. Note that "at %" means atomic percent.

A molding die according to the present invention includes a release film composed of the above-described amorphous alloy. The amorphous alloy according to the present invention, which is an amorphous alloy having chemical stability, may form a glass-molding die having chemical stability and good releasability. In addition, this glass-molding die has a high hardness, and thus flaws are less likely to occur therein in a molding process.

Figure 1:
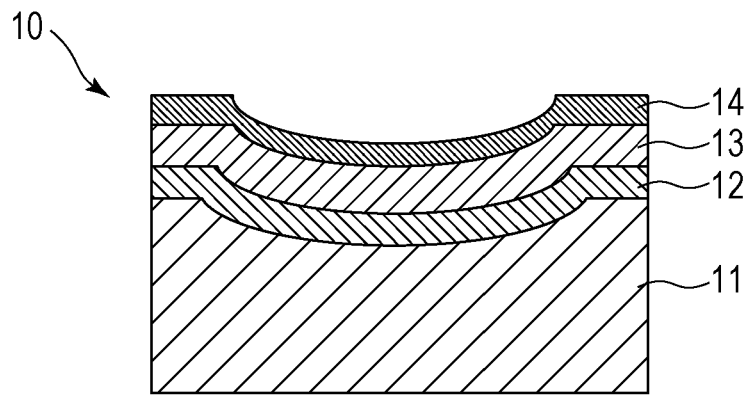
FIG. 1 is a schematic diagram illustrating a molding die according to an embodiment of the present invention.

FIG. 1 is a schematic diagram illustrating a molding die according to an embodiment of the present invention. In this embodiment, as shown in FIG. 1, a molding die 10 includes a carbide substrate 11 composed of sintered tungsten carbide (carbide J05, produced by FUJI DIE Co., Ltd.), a Ti layer 12 stacked on the carbide substrate 11, a TiN layer 13 stacked on the Ti layer 12, and a release film 14 stacked on the TiN layer 13. The release film 14 is composed of the amorphous alloy according to the present invention, which is a Re—Ir—Nb alloy.

The Ti layer 12, the TiN layer 13, and the release film 14 are sequentially formed on the carbide substrate 11 by a physical vapor deposition method such as sputtering. The release film 14 having a desired alloy composition ratio may be formed by sputtering using a target having a desired composition ratio or by multi-target sputtering using a sputtering apparatus 20 having a plurality of targets as shown in FIG. 2.

The film formation method is not limited to this as long as an alloy having the desired composition ratio, which is important for the amorphous alloy according to the present invention, is produced. Other physical deposition methods such as arc plasma ion plating and ion beam sputtering may be employed as a film formation method to form an amorphous alloy film having similar characteristics. Needless to say, alternatively, an alloy having similar characteristics may be produced in the form of bulk by melt-mixing metal materials and subsequently rapidly cooling the mixture.

Figure 2:
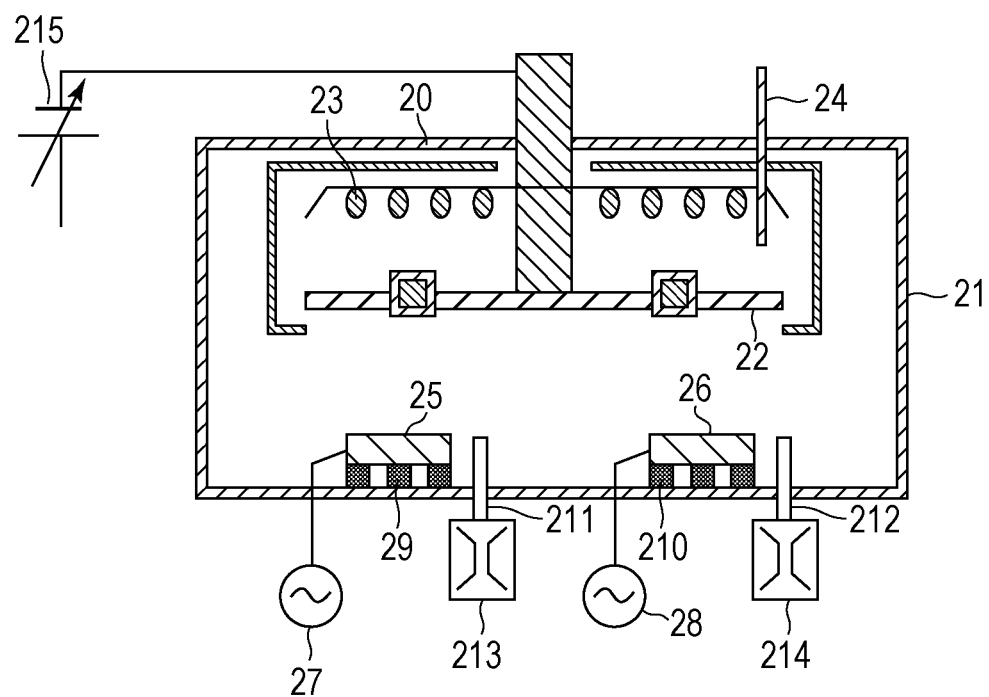
FIG. 2 is a diagram illustrating a sputtering apparatus used for performing coating with an amorphous alloy according to the present invention.

FIG. 2 is a diagram illustrating a sputtering apparatus used for performing coating with the amorphous alloy according to the present invention. Referring to FIG. 2, a method for forming the release film 14 is described below. A sputtering apparatus 20 includes a vacuum chamber 21, a substrate holder 22 disposed in the vacuum chamber 21, a halogen lamp heater 23, a thermocouple thermometer 24, a Re sputtering target 25, a Nb sputtering target 26, an Ir sputtering target (not shown), an RF power source 27 for the Re sputtering target 25, an RF power source 28 for the Nb sputtering target 26, an RF power source (not shown) for the Ir sputtering target, a magnet 29 for the Re sputtering target 25, a magnet 210 for the Nb sputtering target 26, a magnet (not shown) for the Ir sputtering target, an Ar gas supply line 211 for the Re sputtering target 25, an Ar gas supply line 212 for the Nb sputtering target 26, an Ar gas supply line (not shown) for the Ir sputtering target, a mass flow controller 213 for the Re sputtering target 25, a mass flow controller 214 for the Nb sputtering target 26, a mass flow controller (not shown) for the Ir sputtering target, a DC bias power source 215 for the substrate holder 22, and an exhaust system (not shown) that evacuate the vacuum chamber 21 appropriately.

After the Ti layer 12 and the TiN layer 13 are sequentially stacked on the carbide substrate 11 having a desired shape, the carbide substrate 11 is mounted on the substrate holder 22. Then, the vacuum chamber 21 is evacuated. The carbide substrate 11 is heated to a temperature of 400° C. to 600° C. using the halogen lamp heater 23 and the thermocouple thermometer 24. In the film formation process, the carbide substrate 11 is heated in order to enhance the adhesion of the film to the substrate.

A potential of −100 to −600 V is applied to the substrate holder 22 using the DC bias power source 215. The bias potential allows positively-charged Ar ions with high energy to be attracted to the carbide substrate 11 in the film formation process. This enhances the adhesion of an alloy to the substrate and increases the density of the alloy, which enhances the hardness of the alloy.

In order to minimize the amount of vacuum chamber residual gases taken into the film, the vacuum chamber 21 is evacuated to a high vacuum at about a lower $10^{-5}$ Pa level and then Ar gas is introduced into the vacuum chamber 21 using the mass flow controller at about 10 to 90 sccm through the Ar gas supply line. The degree of vacuum in the vacuum chamber 21 is changed from 0.1 Pa to 1 Pa by introducing Ar gas. Then, plasma is formed on the targets using the RF power supplies and the magnets disposed on the rear sides of the targets. Then, film formation is performed by three-target sputtering using Re, Nb, and Ir targets. The composition of an alloy film can be controlled by controlling the power ratio among the RF power supplies.

As a result of extensive study, the inventors of the present invention succeeded in increasing the hardness of an alloy film by using a Re—Ir alloy having a high hardness as a main component of the amorphous alloy according to the present invention and in making the alloy amorphous by adding Nb having an atomic radius markedly different from Re and Ir and having negative mixing enthalpy with Re and Ir (−26 kJ/mol and −56 kJ/mol, respectively).

Specifically, the amorphous alloy according to the present invention contains 54 at % or more and 79 at % or less Re, 8 at % or more and 28 at % or less Ir, and 11 at % or more and 18 at % or less Nb. The amorphous alloy preferably contains 58 at % or more and 77 at % or less Re, 8 at % or more and 28 at % or less Ir, and 12 at % or more and 17 at % or less Nb.

According to the present invention, an amorphous alloy having the above-described composition may form an amorphous alloy film having a high hardness of 18 GPa or more, which is higher than that of carbide.

Elements other than Re, Nb, and Ir contained in the amorphous alloy film according to the present invention are only trace amounts of impurities contained in target materials and inevitable components resulting from particles and residual gases in the vacuum deposition chamber. When the alloy film is formed by vacuum deposition, oxygen is inevitably taken into the film due to the residual gases such as water remaining in the vacuum deposition chamber in the film formation process. Ideally, there is no oxygen in the film, but about 0.1 at % to 1 at % oxygen relative to the total of the amorphous alloy is inevitably introduced even when an effort is made to reduce the amount of gases adsorbed on the chamber inner wall by long-time evacuation and baking of the chamber. However, even when containing the inevitable oxygen introduced in the film formation process, the amorphous alloy film according to the present invention has desired amorphousness and hardness.

An example of elements inevitably contained in the amorphous alloy according to the present invention, other than oxygen, is Fe. The content of the inevitable components other than oxygen contained in the amorphous alloy according to the present invention may be 0.03 at % or less relative to the total of the amorphous alloy.

Figure 3:
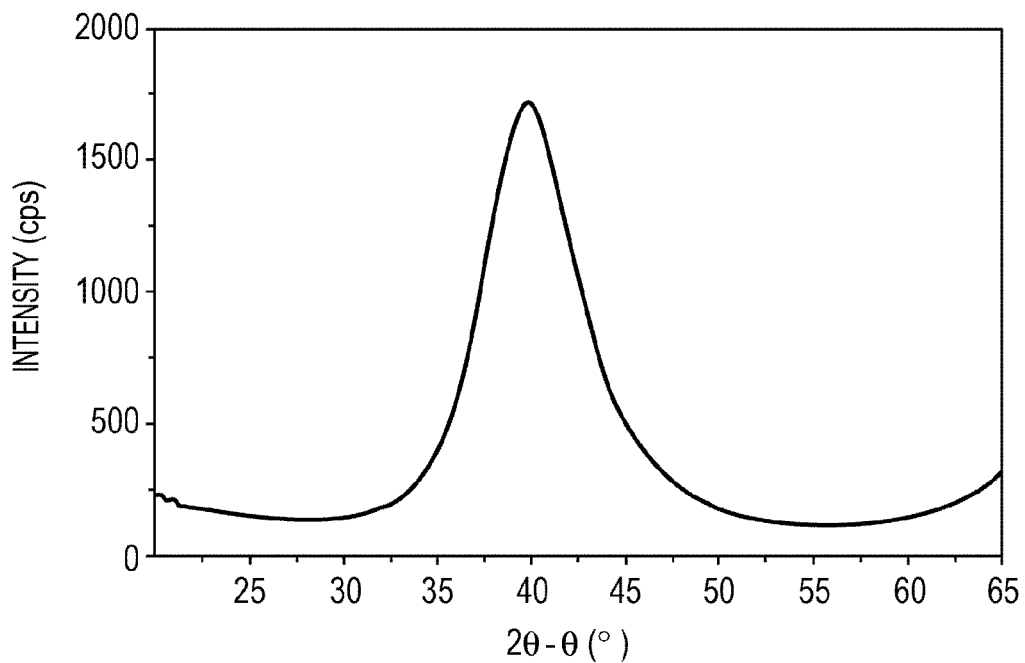
FIG. 3 is an X-ray diffraction pattern of an amorphous alloy according to the present invention.

FIG. 3 is an X-ray diffraction pattern of an amorphous alloy of composition Re70-Ir16-Nb14(at %), which was determined by a θ-2θ method using Phillips X'pert. FIG. 3 shows that the alloy is amorphous.

A method for producing an optical element according to the present invention includes press-molding a glass preform with the above-described molding die.

Figure 4:
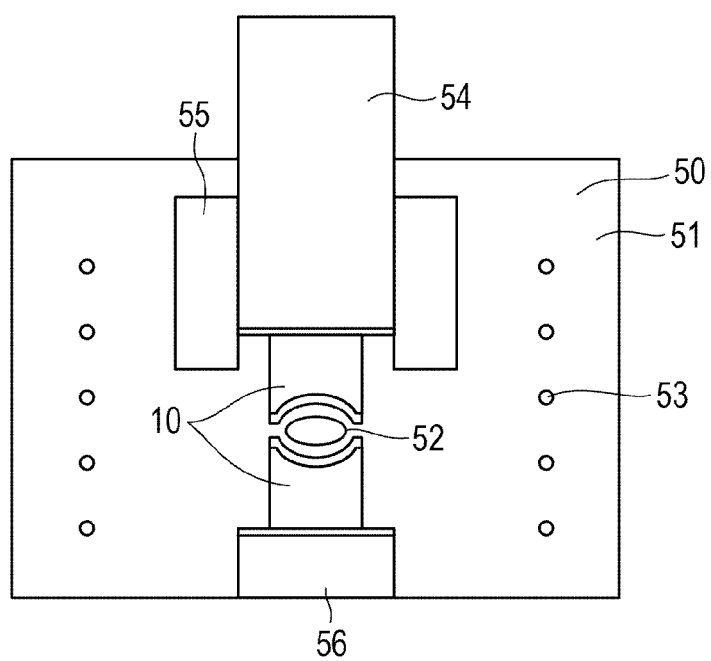
FIG. 4 is a schematic diagram illustrating a molding machine used in a method for producing an optical element according to the present invention.

FIG. 4 is a schematic diagram illustrating a molding machine used in a method for producing an optical element according to the present invention. The method for producing an optical element is described with reference to FIG. 4. A molding machine 50 includes a chamber 51, the molding die 10 coated with the amorphous alloy according to the present invention. The molding machine 50 further includes a glass preform 52 to be molded, a heater 53, a shaft 54 used for pressing an upper part of the die, a drum mold 55 that determines an axial position during pressing the upper part of the die, and a support base 56 that supports a lower part of the die and that applies pressure.

The inside of the chamber 51 is purged with nitrogen. Subsequently, the glass preform 52, the molding die 10, and the drum mold 55 are heated to a desired temperature using the heater 53. Then, the glass preform 52 is press-molded by the upper and lower parts of the molding die 10 using the shaft 54 and the support base 56. When the glass preform is composed of glass containing F (fluorine), Bi (bismuth), or B (boron), the amorphous alloy according to the present invention is particularly effective compared with crystalline alloy films.

Repeated molding operations result in carbide powder coming off slide portions because the upper part of the die slides on the drum mold. Although the carbide powder may be dragged into the die and pressed together with glass, no flaw occurs in the release film of the molding die 10 because the release film has a higher hardness than carbide powder. Thus, a poor appearance of the glass molded product due to the flaws in the molding die can be prevented from occurring.

Since the surface of the die in contact with glass is a chemically stable amorphous alloy film having a stable passive film formed on the surface thereof and no crystal grain boundary, fusion of glass to the die is less likely to occur. In particular, when highly reactive glass containing fluorine or easily reducible components such as Bi is molded, the chemical stability of the amorphous alloy film is particularly effective compared with a release film composed of a crystalline alloy. The thickness of the release film of the molding die according to the present invention, which is composed of an amorphous alloy, is preferably 20 nm or more and 1000 nm or less. This is because, in the film formation process, an excessively small thickness of the release film results in failure to form a sufficiently layered film but results in formation of an island-shaped film, which may include some portion on which the amorphous alloy according to the present invention is not stacked in a microscopic scale. When the thickness of the release film is 20 nm or more, a layered film may be formed by sputtering or the like.

When the thickness of the release film is on the order of micrometers, that is, more than 1000 nm, the stress in the release film is increased and consequently the release film may be peeled off. The release film having a large thickness exceeding 1000 nm can be formed by taking measures for prevention of peeling such as stress control by adjusting the film formation conditions and insertion of an adhesion layer. However, the release film needs not to have such a large thickness from the viewpoint of molding. Thus, formation of the release film having a thickness of 1000 nm or less saves labor of taking measures for prevention of peeling such as stress control by adjusting the film formation conditions and insertion of an adhesion layer.

The releasability may be further improved by coating the glass preform with DLC (diamond-like carbon) or the like. In this case, the glass preform can be released at a high temperature after molding, and thus the tact time may be shortened. Thus, the improvement in productivity may be expected. Even in this case, the occurrence of flaws in the die due to contact with DLC formed on the glass preform during a molding process can be suppressed since the amorphous alloy on the die surface has a higher hardness than the DLC film coating formed on the glass preform and having a hardness of ten-odd GPa.

Examples of the optical elements produced by the method according to the present invention include a lens, a prism, and a diffraction grating.

EXAMPLES

Alloy films formed by the film formation method using the sputtering apparatus according to the embodiment are described below in Examples. The present invention is not limited to the film formation method. Comparative examples are also provided to show the advantages of the present invention.

Example 1

An amorphous alloy film and a molding die including the amorphous alloy film according to the present invention are described below as an example.

As raw materials for an amorphous alloy, a sintered Re target material having a diameter of 76.2 mm (3 inches) and a purity of 99.9%, a molten Nb target material having a diameter of 76.2 mm (3 inches) and a purity of 99.9%, and a sintered Ir target material having a diameter of 76.2 mm (3 inches) and a purity of 99.9% were used for Re, Nb, and Ir, respectively. The alloy film was formed by the film formation method according to the embodiment using these target materials.

In Example 1, a molding die included, as an upper part of the die, a carbide J05 die processed into a convex shape having an outer dimension of 18 mm and a radius of curvature of 22 mm by grinding and polishing. On the surface of the upper part of the die, a Ti layer and a TiN layer were stacked to a total thickness of 1 μm. In addition, a release film was formed on the TiN layer by stacking, to a thickness of 200 nm, an amorphous alloy containing 63 at % Re, 25 at % Ir, and 12 at % Nb (determined with an XPS (X-ray photoelectron spectroscopy) apparatus, PHI Quantera SXM, produced by ULVAC-PHI, Inc.).

A lower part of the die was a carbide J05 die processed into a concave shape having an outer dimension of 18 mm and a radius of curvature of 22 mm by grinding and polishing. On the surface of the lower part of the die, a Ti layer and a TiN layer were stacked to a total thickness of 1 μm. In addition, a release film was formed on the TiN layer by stacking, to a thickness of 200 nm, an amorphous alloy containing 63 at % Re, 25 at % Ir, and 12 at % Nb (determined with an XPS apparatus, PHI Quantera SXM, produced by ULVAC-PHI, Inc.).

The hardness of the amorphous alloy was 18 GPa (measured with a nanoindenter produced by Agilent Technologies, Inc.). As a result of X-ray diffraction, the alloy was found to be amorphous (determined by a θ-2θ method using Phillips X'pert).

Using this molding die, a fluorine-containing glass preform (8.7 wt % F, 54.5 wt % $SiO_2$, 17.9 wt % $B_2O_3$, 18.4 wt % $K_2O$, 0.3 wt % $Al_2O_3$, and 0.2 wt % $Sb_2O_3$, determined by ICP-AES (inductively coupled plasma-atomic emission spectroscopy) analysis) was molded at 610° C. After the molding, serious flaws and fusion of glass were not observed on the die surface. The molded glass did not have a poor appearance such as serious flaws.

As described above, even highly reactive glass containing fluorine, which is difficult to mold, can be molded by using the molding die according the present invention.

Example 2

As raw materials for an amorphous alloy, a sintered Re target material having a diameter of 76.2 mm (3 inches) and a purity of 99.9%, a molten Nb target material having a diameter of 76.2 mm (3 inches) and a purity of 99.9%, and a sintered Ir target material having a diameter of 76.2 mm (3 inches) and a purity of 99.9% were used for Re, Nb, and Ir, respectively. The alloy film was formed by the film formation method according to the embodiment using these target materials.

In Example 2, a molding die included, as an upper part of the die, a carbide J05 die processed into a convex shape having an outer dimension of 18 mm and a radius of curvature of 22 mm by grinding and polishing. On the surface of the upper part of the die, a Ti layer and a TiN layer were stacked to a total thickness of 1 μm. In addition, a release film was formed on the TiN layer by stacking, to a thickness of 250 nm, an amorphous alloy containing 77 at % Re, 11 at % Ir, and 12 at % Nb (determined with an XPS apparatus, PHI Quantera SXM, produced by ULVAC-PHI, Inc.). A lower part of the die was a carbide J05 die processed into a concave shape having an outer dimension of 18 mm and a radius of curvature of 22 mm by grinding and polishing. On the surface of the lower part of the die, a Ti layer and a TiN layer were stacked to a total thickness of 1 μm. In addition, a release film was formed on the TiN layer by stacking, to a thickness of 200 nm, an amorphous alloy containing 77 at % Re, 11 at % Ir, and 12 at % Nb (determined with an XPS apparatus, PHI Quantera SXM, produced by ULVAC-PHI, Inc.).

The hardness of the amorphous alloy was 18 GPa (measured with a nanoindenter produced by Agilent Technologies, Inc.). As a result of X-ray diffraction, the alloy was found to be amorphous (determined by a θ-2θ method using Phillips X'pert).

Using this molding die, a glass preform containing B and Bi (37.4 wt % B, 32.8 wt % O, 26.2 wt % Bi, 1.0 wt % Zn, 1.0 wt % Na, 1.0 wt % Si, and 0.6 wt % Sr, determined by energy dispersive X-ray fluorescence analysis) was molded at 460° C. After the molding, serious flaws and fusion of glass were not observed on the die surface. The molded glass did not have a poor appearance such as serious flaws.

As described above, even highly reactive glass containing B and Bi, which is difficult to mold, can be molded by using the molding die according the present invention.

Examples 3 to 9

As shown in Table 1, amorphous alloys containing 54 at % or more and 79 at % or less Re, 8 at % or more and 28 at % or less Ir, and 11 at % or more and 18 at % or less Nb were prepared. The hardness of each amorphous alloy was 18 GPa or more as in Examples 1 and 2.

The alloy composition was determined with an XPS apparatus, PHI Quantera SXM, produced by ULVAC-PHI, Inc. The hardness was measured with a nanoindenter produced by Agilent Technologies, Inc. The crystallinity was determined by a θ-2θ method using Phillips X'pert. Since the alloys prepared in Examples 3 to 9 had a high hardness and were amorphous, dies on which the alloy films of Examples 3 to 9 were stacked were considered to have the same glass molding performance as in Examples 1 and 2.

Table 1 summarizes the results of Examples 1 to 9.

TABLE 1

| Example | Composition (at %) | | | Hardness (GPa) | Crystallinity |
| --- | --- | --- | --- | --- | --- |
| | Re | Ir | Nb | | |
| 1 | 63 | 25 | 12 | 18 | Amorphous |
| 2 | 77 | 11 | 12 | 18 | Amorphous |
| 3 | 54 | 28 | 18 | 18 | Amorphous |
| 4 | 61 | 23 | 16 | 18 | Amorphous |
| 5 | 79 | 10 | 11 | 18 | Amorphous |
| 6 | 59 | 24 | 17 | 18 | Amorphous |
| 7 | 58 | 26 | 16 | 18 | Amorphous |
| 8 | 76 | 8 | 16 | 19 | Amorphous |
| 9 | 70 | 16 | 14 | 18 | Amorphous |

Comparative Examples 1 to 12

In order to show the advantages of the present invention, the results of Comparative Examples 1 to 12 using a Re—Ir—Nb composition that is not within the range of the composition of the present invention are shown in Table 2. The alloy composition was determined with an XPS apparatus, PHI Quantera SXM, produced by ULVAC-PHI, Inc. The hardness was measured with a nanoindenter produced by Agilent Technologies, Inc. The crystallinity was determined by a θ-2θ method using Phillips X'pert. In Comparative Examples, the alloys were crystallized or became unsatisfactory in terms of hardness. Although amorphous alloys have chemical stability, they lose chemical stability when crystallized.

TABLE 2

| Comparative Example | Composition (at %) | | | Hardness (GPa) | Crystallinity |
| --- | --- | --- | --- | --- | --- |
| | Re | Ir | Nb | | |
| 1 | 71 | 20 | 9 | 21 | Crystalline |
| 2 | 68 | 12 | 20 | 20 | Crystalline |
| 3 | 55 | 36 | 9 | 19 | Crystalline |
| 4 | 60 | 29 | 11 | 21 | Crystalline |
| 5 | 68 | 0 | 32 | 14 | Crystalline |
| 6 | 44 | 44 | 12 | 22 | Crystalline |
| 7 | 80 | 7 | 13 | 15 | Amorphous |
| 8 | 72 | 8 | 20 | 14 | Amorphous |
| 9 | 57 | 29 | 14 | 17 | Crystalline |
| 10 | 50 | 36 | 14 | 17 | Crystalline |
| 11 | 50 | 50 | 0 | 23 | Crystalline |
| 12 | 33 | 67 | 0 | 20 | Crystalline |

The amorphous alloy and the molding die including the amorphous alloy according to the present invention may be used for producing optical elements such as a lens and a prism by molding because the amorphous alloy has chemical stability, good releasability, and a high hardness and flaws are less likely to occur in the molding die in a molding process.

The present invention provides an amorphous alloy having chemical stability, good releasability, and a high hardness and a molding die including the amorphous alloy, in which flaws are less likely to occur in a molding process. The present invention also provides a method for producing an optical element with the molding die.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-183950, filed Aug. 23, 2012, which is hereby incorporated by reference herein in its entirety.

What is claimed is:

1. An amorphous alloy containing:
   54 at % or more and 79 at % or less Re;
   8 at % or more and 28 at % or less Ir; and
   11 at % or more and 18 at % or less Nb.

2. A molding die comprising a film composed of an amorphous alloy,
   wherein the amorphous alloy contains:
   54 at % or more and 79 at % or less Re;
   8 at % or more and 28 at % or less Ir; and
   11 at % or more and 18 at % or less Nb.

3. A method for producing an optical element,
   the method including press-molding a glass preform with a molding die comprising a film composed of an amorphous alloy,
   wherein the amorphous alloy contains:
   54 at % or more and 79 at % or less Re;
   8 at % or more and 28 at % or less Ir; and
   11 at % or more and 18 at % or less Nb.

* * * * *